(12) United States Patent
Shimomura et al.

(10) Patent No.: US 9,103,049 B2
(45) Date of Patent: Aug. 11, 2015

(54) METHOD FOR MELTING SEMICONDUCTOR WAFER RAW MATERIAL AND CRYSTAL GROWING METHOD FOR SEMICONDUCTOR WAFER

(75) Inventors: Koichi Shimomura, Kanagawa (JP); Eiichirou Kotoura, Kanagawa (JP); Hiroyuki Ohta, Kanagawa (JP)

(73) Assignee: SUMCO TECHXIV KABUSHIKI KAISHA, Kanagawa (JP)

(*) Notice: Subject to any disclaimer, the term of this patent is extended or adjusted under 35 U.S.C. 154(b) by 2049 days.

(21) Appl. No.: 11/826,000

(22) Filed: Jul. 10, 2007

(65) Prior Publication Data
US 2008/0011222 A1    Jan. 17, 2008

(30) Foreign Application Priority Data

Jul. 13, 2006 (JP) ................................. 2006-192475

(51) Int. Cl.
*C30B 15/14* (2006.01)
*C30B 11/00* (2006.01)
(Continued)

(52) U.S. Cl.
CPC ............... *C30B 15/14* (2013.01); *C30B 11/003* (2013.01); *C30B 29/06* (2013.01); *C30B 35/00* (2013.01); *Y10T 117/1068* (2015.01)

(58) Field of Classification Search
CPC ...... C30B 29/06; C30B 15/14; C30B 11/003; C30B 35/00; Y10T 117/1068
USPC .................................... 117/11, 13, 30, 34, 35
See application file for complete search history.

(56) References Cited

U.S. PATENT DOCUMENTS 5,766,347 A * 6/1998 Shimomura et al. .......... 117/217

5,814,148 A * 9/1998 Kim et al. ....................... 117/13
(Continued)

FOREIGN PATENT DOCUMENTS

| JP | 03183689 A * | 8/1991 | ............. C30B 15/14 |
| JP | 05-009097 | 1/1993 | |

(Continued)

OTHER PUBLICATIONS

Computer Translation of JP 2003-002782 (2003).*
(Continued)

*Primary Examiner* — Matthew Song
(74) *Attorney, Agent, or Firm* — Handal & Moforsky LLC

(57) ABSTRACT

The crucible and the side heater are held in the respective initial positions, and the raw material is put into the crucible. These initial positions are positions where the crucible side surface is mainly heated by the side heater. When the side heater heats the crucible side surface, the raw material is melted to form melt. When a part or all of the raw material is melted, the crucible is raised from the initial position or the side heater is lowered from the initial position. At this time, the position of the crucible or the side heater is adjusted such that the amount of heat applied to the lower side curved portion of the crucible side surface is greater than that in the initial relative position between the crucible and the side heater. And, if the crucible bottom part is heated by the side heater while the relative positions of the crucible and the side heater is maintained, the amount of heat applied to the crucible bottom part is increased as compared to the amount of heat applied to the crucible side surface, and the convection in the melt that makes the gas bubbles spatter to the outside. In this way, the gas bubbles are eliminated from the melt. As a result, the amount of gas bubbles in the melt can be reduced without deforming the crucible, and occurrence of pinhole defects in the wafer can be suppressed.

10 Claims, 5 Drawing Sheets

(51) Int. Cl.
*C30B 29/06* (2006.01)
*C30B 35/00* (2006.01)

(56) References Cited

U.S. PATENT DOCUMENTS

| | | | | |
|---|---|---|---|---|
| 5,919,303 | A | * | 7/1999 | Holder .............................. 117/13 |
| 5,932,002 | A | * | 8/1999 | Izumi .............................. 117/13 |
| 5,940,722 | A | * | 8/1999 | Tamura ......................... 438/471 |
| 6,340,390 | B1 | | 1/2002 | Asano et al. |
| 2002/0020339 | A1 | * | 2/2002 | Holder .............................. 117/19 |
| 2002/0166499 | A1 | * | 11/2002 | Kimura ........................... 117/13 |
| 2005/0139149 | A1 | | 6/2005 | Maeda et al. |

FOREIGN PATENT DOCUMENTS

| | | | |
|---|---|---|---|
| JP | 2000-169287 | | 6/2000 |
| JP | 2003002782 A | * | 1/2003 .............. C30B 29/06 |
| TW | 583353 B | | 4/2004 |
| TW | 200415267 A | | 8/2004 |
| WO | WO 02/44446 A2 | | 6/2002 |

OTHER PUBLICATIONS

Taiwanese Office Action and English translation regarding related application TW 201103095SUM-01.

* cited by examiner

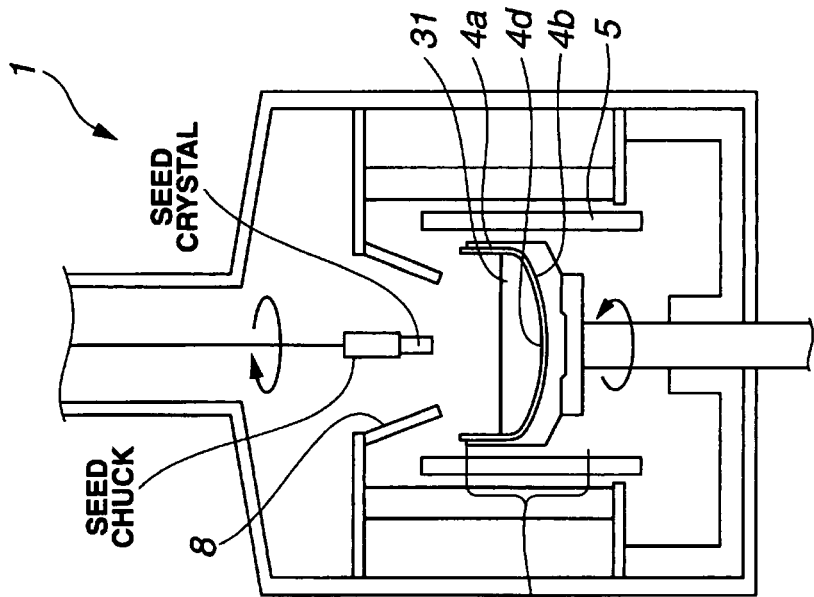
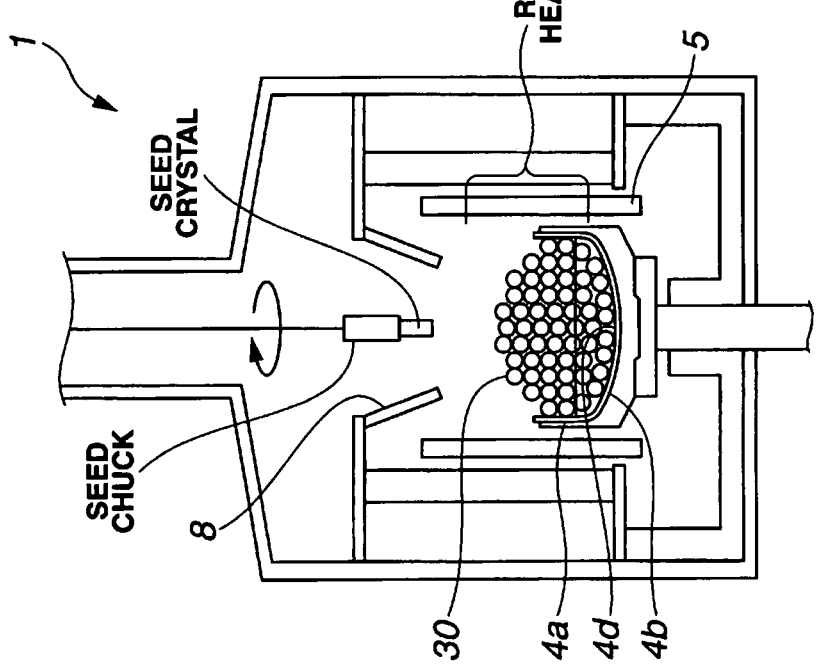
FIG.3A
FIG.3B

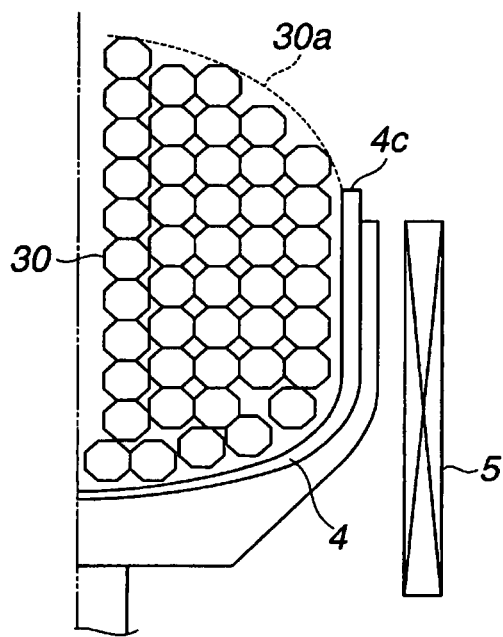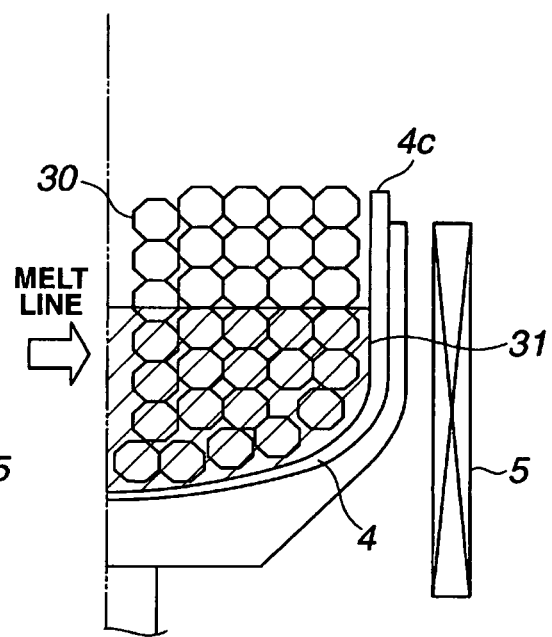
FIG.5A  FIG.5B

METHOD FOR MELTING SEMICONDUCTOR WAFER RAW MATERIAL AND CRYSTAL GROWING METHOD FOR SEMICONDUCTOR WAFER

CROSS-REFERENCE TO RELATED APPLICATION

This application claims priority Japanese Patent Application 2006-192475 filed on Jul. 13, 2006.

BACKGROUND OF THE INVENTION

1. Field of the Invention

The present invention relates to a method for melting semiconductor wafer raw material, in which the semiconductor wafer raw material is placed in a crucible of a single crystal manufacturing apparatus, and is melted by heating the crucible with a side heater, and particularly relates to a melting method for semiconductor wafer raw material that uses a side heater to heat the crucible bottom part to reduce the amount of gas bubbles in the melt.

2. Description of the Related Art

To manufacture the single crystal silicon using the single crystal manufacturing device, chunks of polycrystalline as raw material are put into the quartz crucible. The side surface of the crucible is then heated using the side heater that is arranged so as to surround the side of the crucible. As the material has been melted, the silicon melt is generated. On the tip of a crystal pulling mechanism disposed in an upper part of the crucible, a silicon seed crystal is disposed. After being dipped into the silicon melt, the seed crystal is pulled up while being rotated around the pulling up axis. The silicon is then deposited in accordance with the crystal orientation of the seed crystal, whereby the ingot of the single crystal silicon can be formed.

From the ingot of the single crystal silicon, wafers are cut. However, those cut wafers may have bubble-shaped defects, which is called the pinhole defect. This pinhole defect occurs when bubbles existed in the melt are incorporated into the single crystal silicon, and is considered to be caused by the bubble existed on the surface of the inner wall of the crucible, SiO gas attached to the raw material, and the like, at the time of melt of the raw material.

It should be noted that the Japanese Patent Application Laid-Open No. 05-9097 (Patent Literature 1), and the Japanese Patent Application Laid-Open No. 2000-169287 (Patent Literature 2) disclose a technique in which the pinhole defects are reduced using a pressure control in the furnace such as performing the melting process of the raw material under the low pressure and performing the pulling process of the ingot under the high pressure.

However, the quality of the crystal depends on the pressure in the furnace. To achieve the high quality ingot, it is necessary to accurately control the pressure in the furnace during manufacturing the ingot. Although the technique disclosed in the above Patent Literatures 1 and 2 is directed to controlling the pressure in the furnace to reduce the pinhole defects, the quality of the crystal is not taken into consideration in this technique. Accordingly, it is difficult for the technique disclosed in the above Patent Literatures 1 and 2 to achieve both improvement of the quality and reduction in the pinhole defect.

The present invention has been made in view of the above circumstances, and has an object to reduce the bubbles in the melt and pinhole defects occurring in the wafer.

OBJECTS AND SUMMARY OF THE INVENTION

A first aspect of the invention provides a method for melting semiconductor wafer raw material using a single crystal manufacturing apparatus that comprises a crucible and a side heater provided so as to surround a side surface of the crucible, the method comprising: a side heating step of mainly heating the side surface of the crucible using the side heater for melting the raw material in the crucible to form melt; an adjusting step of adjusting a relative position between the crucible and the side heater such that the amount of heat applied to a bottom part of the crucible by the side heater is greater than that in the side heating step; and a bottom heating step of maintaining the adjusted relative position and heating the bottom part of the crucible by the side heater.

A second aspect of the invention provides the method for melting semiconductor wafer raw material according to the first aspect of the invention, wherein the adjusting step is performed after all the material is melted in the side heating step.

A third aspect of the invention provides the method for melting semiconductor wafer raw material according to the first aspect of the invention, wherein the adjusting step is performed after a part of the material is melted in the side heating step.

The first to third aspects of the invention relate to a method for melting the raw material for semiconductor wafer, using a crucible and a side heater provided so as to surround the side surface of the crucible. The present invention has been made on the basis of the discovery that, by raising the temperature of the lower portion of the melt through heating the bottom part of the crucible, the temperature difference between the upper and lower portions of the melt is increased and the strong convection in the melt occurs, whereby the gas bubbles can be spattered to the outside. Although, in an actual apparatus, a quartz crucible is provided inside a graphite crucible, the quartz crucible and the graphite crucible are to be collectively called a crucible herein. The crucible bottom part refers to the entire bottom surface which is curved ranging from the lower portion of the crucible side surface to the bottom end part of the crucible.

The crucible and the side heater are respectively held in the initial positions, and the raw material is put into the crucible. These initial positions are positions where the crucible side surface is mainly heated by the side heater. When the side heater heats the crucible side surface, the raw material is melted to form the melt. After a part or all of the raw material is melted, the crucible is raised from the initial position or the side heater is lowered from the initial position. At this time, the position of the crucible or the side heater is adjusted such that the amount of heat applied to the crucible bottom part is greater than that in the initial relative position of the crucible and the side heater. And, if the crucible bottom part is heated by the side heater while the relative positions of the crucible and the side heater is maintained, the amount of heat applied to the crucible bottom part is increased, as compared to the amount of heat applied to the crucible side surface, resulting in the convection in the melt being so intensified that the gas bubbles are spattered to the outside. In this way, the gas bubbles are eliminated from the melt.

A fourth aspect of the invention provides a method for melting semiconductor wafer raw material using a single crystal manufacturing apparatus that comprises a crucible and a side heater arranged so as to surround a side surface of the crucible, the method comprising: an adjusting step of adjusting a relative position between the crucible and the side heater such that amount of heat applied to a bottom part of the crucible by the side heater is greater than amount of heat applied to the side surface of the crucible; and a bottom heating step of maintaining the adjusted relative position and heating the bottom part of the crucible for melting the raw material to form melt.

As is the case with the first to third aspects of the inventions, the fourth aspect of the invention relates to a method for melting semiconductor wafer raw material using a crucible and a side heater which is provided so as to surround the side surface of the crucible. The present invention has been made on the basis of the discovery that, by heating the crucible bottom part, the convection in the melt for spattering the gas bubbles to the outside can be strong.

First, the raw material is put into the crucible. Then, the crucible is raised from the initial position or the side heater is lowered from the initial position to a position where the amount of heat applied to the crucible bottom part is greater than the amount of heat applied to the crucible side surface. And, if the crucible bottom part is heated by the side heater while the relative position between the crucible and the side heater is maintained, the raw material is melted to form the melt. Additionally, since the amount of heat applied to the crucible bottom part is greater than the amount of heat applied to the crucible side surface, the convection in the melt for spattering the gas bubbles to the outside can be strong. In this way, the gas bubbles are eliminated from the melt.

A fifth aspect of the invention provides the method for melting semiconductor wafer raw material according to the first or fourth aspect of the invention, wherein in the adjusting step, within a range where the crucible moves up and down, the crucible is raised to not lower than a position where the bottom part of the crucible is maintained to a part where radiation heat by the side heater is the most intense.

A sixth aspect of the invention provides the method for melting semiconductor wafer raw material according to the first or fourth aspect of the invention, wherein in the adjusting step, within a range where the side heater moves up and down, the side heater is lowered to not higher than a position where the bottom part of the crucible is maintained to a part where radiation heat with the side heater is the most intense.

The fifth and sixth aspects of inventions relate to a specific method for adjusting the relative position between the crucible and the side heater. The rising position of the crucible when the crucible is to be raised is specified to be a position where the crucible bottom part is maintained in the part where the radiation heat of the side heater is the most intense, or a position thereabove. The lowering position of the side heater when the side heater is to be lowered is specified to be a position where the crucible bottom part is maintained in the part where the radiation heat of the side heater is the most intense, or a position thereunder.

A seventh aspect of the invention provides the method for melting semiconductor wafer raw material according to the first aspect of the invention, wherein the radiation heat by the side heater in the bottom heating step is more intense than the radiation heat by the side heater in the side heating step.

The seventh aspect of the invention provides a method of adjusting the radiation heat of the side heater. After the crucible is raised, the bottom part of the crucible is mainly heated by the side heater. In such a state, if the raw material is left in the crucible, the melting speed for the raw material can be higher by increasing the electric power for the side heater to intensify the radiation heat. On the other hand, in such a state, the crucible opening part is not heated intensely as compared to the crucible bottom part. In other words, even if the electric power for the side heater is increased, the crucible opening part is not subjected to high amount of heat which may cause deformation of the crucible opening part.

An eighth aspect of the invention provides the method for melting semiconductor wafer raw material according to the third or fourth aspect of the invention, wherein in the bottom heating step, the crucible is continued to be raised to such a position where a member disposed above the crucible does not interfere with an opening of the crucible and the raw material in the crucible.

The eighth invention provides a method of raising the crucible as high as possible. In order to mainly heat the crucible bottom part with the side heater, it is desirable that the crucible be maintained as high as possible in the heat radiation region for the side heater. However, above the crucible, an upper member, such as the heat shield plate, or the like, may be provided. Therefore, it is desirable that the crucible be raised to a position where this upper member will not interfere with the crucible.

In addition, if the large volume of raw material is placed in the crucible, the raw material may be projected above the crucible opening part. The portion projected above the crucible opening part is referred to as a bridge. The crucible is raised to a position where this bridge will not interfere with the upper member. Sine the level of the bridge is lowered as the raw material are melted, the crucible is raised in accordance with the lowered level of the bridge.

A ninth aspect of the invention provides the method for melting semiconductor wafer raw material according to the first or fourth aspect of the invention, wherein the crucible comprises a first crucible in which the wafer raw material is put and a second crucible inside which a part of the first crucible is installed, when a vertical length of the side heater is L1, a vertical length of the second crucible is L2, and vertical component of a distance from the inner bottom end of the first crucible to a lower end of the side heater is d, the following expression is met: $(½) L2 \leq L1 \leq 2L2$, and in the bottom heating step, the first crucible is maintained in such a position where the following expression is met: $(¼) L1 \leq d \leq (¾) L1$.

A tenth aspect of the invention provides the method for melting semiconductor wafer raw material according to the first or fourth aspect of the invention, wherein in the bottom heating step, the crucible is rotated at 0.5 to 15 rpm.

The ninth and tenth aspect of the invention provides a specific embodiment in which the first or fourth aspect of the invention is efficiently carried out.

An eleventh aspect of the invention provides a crystal growing method for semiconductor wafer, when, after a seed crystal is dipped into melt formed by the method as stated in the first or fourth aspect of the invention, the seed crystal is pulled up to grow crystal, the seed crystal is pulled up while being rotated at a circumferential velocity of 0.136 m/s or faster.

The eleventh aspect of the invention provides a method for preventing the gas bubbles from being taken into the crystal, by rotating single crystal at a speed of 13 rpm or faster, when a single crystal is pulled up from the melt formed in the first invention or the fourth invention.

According to the present invention, the amount of heat applied to the crucible bottom part may be rendered greater than the amount of heat applied to the crucible side surface. By doing so, the convection in the melt in the crucible is strengthened, whereby the gas bubbles can be spattered to the outside. In this way, since the amount of gas bubbles in the melt is reduced, the silicon single crystal formed from this melt contains little gas bubbles. If a wafer is cut from such a silicon single crystal, the wafer formed will have a reduced number of pinhole defects.

With the first or fourth aspect of the invention, even if the radiation heat of the side heater is intensified while the crucible is raised, only the crucible bottom part is mainly heated, thus the crucible opening part will not be excessively heated. Therefore, deformation of the crucible opening part will not occur.

BRIEF DESCRIPTION OF THE DRAWINGS

FIG. 3A is a drawing illustrating a state in which the crucible side surface is heated, and FIG. 3B is a drawing illustrating a state in which the crucible bottom part is heated;

FIG. 5A is a drawing illustrating a state in which the raw material is put into the crucible, and FIG. 5B is a drawing illustrating a state in which the raw material has been melted.

DETAILED DESCRIPTION OF THE PREFERRED EMBODIMENTS

Hereinbelow, embodiments of the present invention will be described with reference to the drawings.

Figure 1:
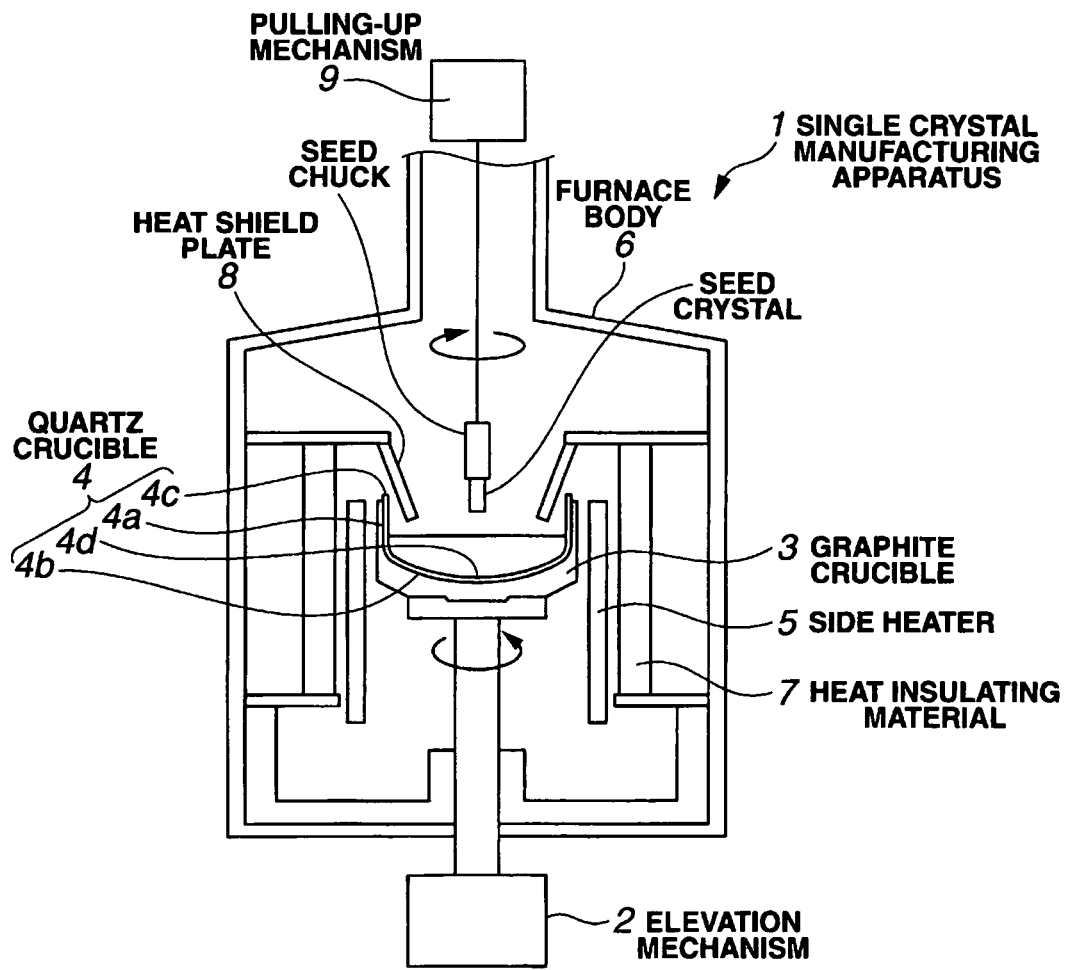
FIG. 1 is a simplified sectional view of a configuration of a single crystal manufacturing apparatus.

FIG. 1 is a simplified sectional view of the configuration of a single crystal manufacturing apparatus.

The single crystal manufacturing apparatus 1 includes a graphite crucible 3 which is connected to an elevation mechanism 2; a quartz crucible 4 which is internally arranged on a part of the side surface and on the bottom surface of the graphite crucible 3; a side heater 5 which is provided so as to surround the side surface of the graphite crucible 3 and the quartz crucible 4; a heat insulating material 7 which is provided between the side heater 5 and the inside wall of a furnace body 6; a heat shield plate 8 which is provided above the quartz crucible 4; and a pulling-up mechanism 9 which is provided above the heat shield plate 8. In some case, the heat shield plate 8 may not be provided. The operation of the respective components of the single crystal manufacturing apparatus 1 is controlled by a controller (not shown).

Both of the graphite crucible 3 and the quartz crucible 4 are raised in the direction of pulling-up the single crystal, and lowered in the direction reverse to that direction in accordance with the operation of the elevation mechanism 2. In addition, both of the graphite crucible 3 and the quartz crucible 4 are rotated around the axis along which they are raised and lowered in accordance with the operation of the elevation mechanism 2. In the present embodiment, in order to adjust the relative positions of the crucible (the graphite crucible 3 and the quartz crucible 4) and the side heater 5, the crucible is vertically moved. However, the side heater 5 may be raised in the direction of pulling-up the single crystal, or lowered in the direction reverse to that direction.

In the present specification, the position within the range of vertical movement of the quartz crucible 4 where the amount of heat applied to the quartz crucible 4 by the side heater 5 is the greatest is called "heat center". When the quartz crucible bottom part 4b is positioned below this heat center, the side heater 5 mainly heats the quartz crucible side surface 4a, while, when the quartz crucible bottom part 4b is positioned above the heat center, the side heater 5 mainly heats the quartz crucible bottom part 4b. The crucible bottom part 4b means the entire bottom surface which is curved from the lower portion of the crucible side surface to the crucible bottom end part.

Figure 2:
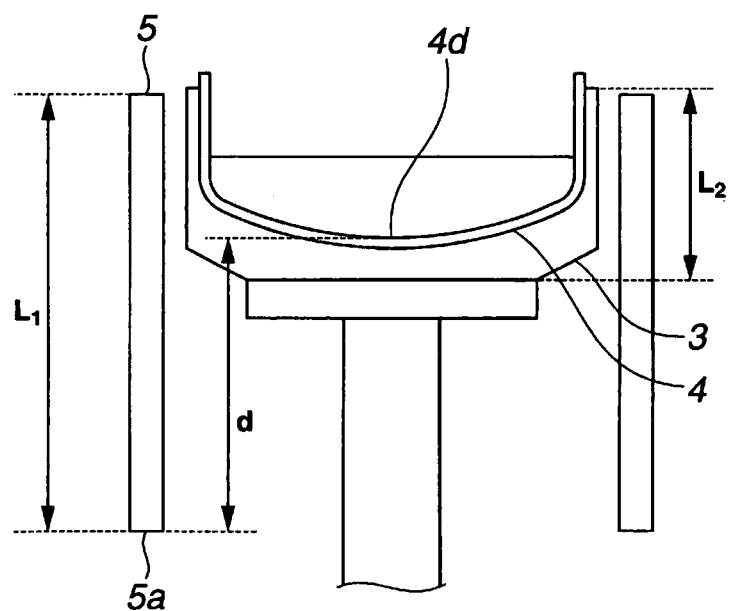
FIG. 2 is a drawing illustrating a definition of dimensions for the single crystal manufacturing apparatus.

Herein, the heat center will be explained with reference to a specific example. As shown in FIG. 2, an assumption is made that the vertical length of the side heater 5 is "$L_1$"; the vertical length of the graphite crucible 3 is "$L_2$"; and the length of the vertical component of the distance from the bottom end part 4d of the inner surface of the quartz crucible 4 to the lower end 5a of the side heater 5 is "d". With the single crystal manufacturing apparatus 1 in the present embodiment, the side heater 5 and the graphite crucible 3 are designed to meet the following expression:

$$(1/2)\, L_2 \leq L_1 \leq 2\, L_2$$

The radiation heat of the side heater 5 is stronger in the region of $(1/4)\, L_1$ to $(1/2)\, L_1$ from the lower end 5a. This region provides the heat center. In this manner, the heat center has a certain breadth. In order to heat the quartz crucible bottom part 4b stronger than the quartz crucible side surface 4a, it is required that the quartz crucible bottom part 4b be positioned at least above the lower end of the heat center. With the single crystal manufacturing apparatus 1 of the present embodiment, heating the quartz crucible bottom part 4b such that the expression:

$$(1/4)\, L_1 \leq d \leq (3/4)\, L_1$$

is met provides the highest efficiency. In the respective embodiments as stated hereinbelow, it is assumed that the quartz crucible 4 is held in a position where such expression is met, for heating the quartz crucible bottom part 4b.

Next, the procedure for melting the raw material using the single crystal manufacturing apparatus 1 will be described in the respective embodiments.

[First Embodiment]

After putting lumps of silicon raw material 30 into the inside of the quartz crucible 4, the elevation mechanism 2 is operated to locate the graphite crucible 3 and the quartz crucible 4 in the initial position. At this time, as shown in FIG. 3A, the graphite crucible 3 and the quartz crucible 4 are located such that the quartz crucible bottom part 4b is positioned below the heat center. Hereinafter, the wording "graphite crucible 3 and the quartz crucible 4" is referred to as the "quartz crucible 4 and the like". In this position, the quartz crucible 4 and the like are held, while the side heater 5 is activated to heat the quartz crucible side surface 4a through the graphite crucible 3. Then, the raw material 30 in the quartz crucible 4 is melted, resulting in a melt 31 being formed. This melt 31 contains gas bubbles which can cause pinhole defects.

After the raw material 30 in the quartz crucible 4 is all melted, the elevation mechanism 2 is operated to raise the quartz crucible 4 and the like. At this time, as shown in FIG. 3B, the quartz crucible 4 and the like are disposed such that the quartz crucible bottom part 4b is positioned at the heat center or above the heat center. In this position, the quartz crucible 4 and the like are held, while the side heater 5 is activated to heat the quartz crucible bottom part 4b. The period of time for heating the quartz crucible bottom part 4b by the side heater 5 must be 60 min or longer, and the upper limit must be provided in the range where the quartz crucible 4 will not be changed or deformed. In heating the quartz crucible bottom part 4b, operating the elevation mechanism 2 to rotate the quartz crucible 4 and the like will provide more effective heating. The rotation rate for the crucible is preferably 0.5 to 15 rpm.

Figure 4:
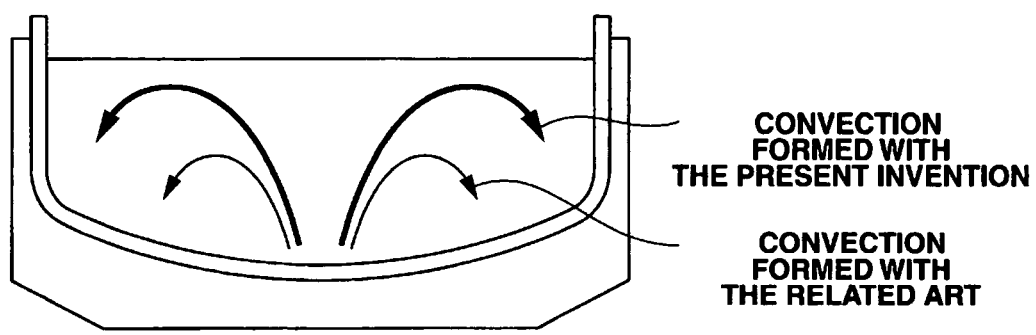
FIG. 4 is a drawing illustrating convection in the crucible.

According to the present embodiment, after the raw material is melted, the amount of heat applied to the crucible bottom part may be made greater than the amount of heat applied to the crucible side surface. By doing so, the natural convection in the melt inside the crucible is so strengthened that the gas bubbles are spattered to the outside, as shown in FIG. 4. Thus, without the radiation heat of the side heater being intensified, the natural convection inside of the crucible can be strengthened, and the amount of gas bubbles in the melt can be minimized. The silicon single crystal formed from such melt contains practically no gas bubbles. If a wafer is cut down from such silicon single crystal, the wafer formed will have a minimized number of pinhole defects.

In addition, even if the radiation heat of the side heater is intensified with the crucible being raised, the crucible opening part will not be excessively heated while the crucible bottom part is mainly heated. Therefore, deformation of the crucible opening part will not be caused.

[Second Embodiment]

Second Embodiment is different from First Embodiment in the timing at which the quartz crucible 4 and the like are raised.

After putting lumps of silicon raw material 30 into the inside of the quartz crucible 4, the elevation mechanism 2 is operated to locate the graphite crucible 3 and the like in the initial position. At this time, as shown in FIG. 3A, the graphite crucible 3 and the like are located such that the quartz crucible bottom part 4b is positioned below the heat center. In this position, the quartz crucible 4 and the like are held, while the side heater 5 is activated to heat the quartz crucible side surface 4a. Then, the raw material 30 inside in the quartz crucible 4 is melted, resulting in a melt 31 being formed. This melt 31 contains gas bubbles which can cause pinhole defects.

After a part of the raw material 30 in the quartz crucible 4 is melted, the elevation mechanism 2 is operated to raise the quartz crucible 4 and the like. In Second Embodiment, before all the raw material 30 having been melted, the quartz crucible 4 and the like are raised, thus the following matters must be considered.

If the large volume of raw material 30 is put into the quartz crucible 4, the raw material 30 may have been piled up higher than the quartz crucible opening part 4c as shown in FIG. 5A. The portion which is thus projected to above the quartz crucible opening part 4c is referred to as a bridge 30a. At the initial stage of melting the raw material 30, the bridge 30a may be left. If the quartz crucible 4 and the like are raised in such a state, the heat shield plate 8 which is positioned above the quartz crucible 4 may interfere with the bridge 30a. In order to avoid such a situation, the quartz crucible 4 and the like are first raised to a position where the bridge 30a does not interfere with the heat shield plate 8. The level of the bridge 30a is gradually lowered as the raw material 30 is being melted, thus the quartz crucible 4 and the like is gradually raised according to the level of the bridge 30a.

And, as shown in FIG. 5B, when the bridge 30a becomes flush with the quartz crucible opening part 4c, the quartz crucible 4 and the like are raised without being restricted by the bridge 30a. At this time, as shown in FIG. 3B, the quartz crucible 4 and the like is placed such that the quartz crucible bottom part 4b is positioned at the heat center or above the heat center. In this position, the quartz crucible 4 and the like are held, while the side heater 5 is activated to heat the quartz crucible bottom part 4b. The period of time for heating the quartz crucible bottom part 4b by the side heater 5 must be 60 min or longer. In heating the quartz crucible bottom part 4b, operating the elevation mechanism 2 to rotate the quartz crucible 4 and the like will provide more effective heating. The rotation rate for the crucible is preferably 0.5 to 15 rpm.

When no bridge exists, the quartz crucible 4 and the like may be raised from the initial position as shown in FIG. 3A to a position as shown in FIG. 3B at the point of time when a part of the raw material has been melted.

According to the present embodiment, after a part of the raw material is melted, the amount of heat applied to the crucible bottom part may be made greater than the amount of heat applied to the crucible side surface. By doing so, the natural convection in the melt inside the crucible is so strengthened that the gas bubbles are spattered to the outside. Thus, without the radiation heat of the side heater being intensified, the natural convection inside the crucible can be strengthened, and the amount of gas bubbles in the melt can be minimized. The silicon single crystal formed from such melt contains practically no gas bubbles. If a wafer is cut down from such silicon single crystal, the wafer formed will have a minimized number of pinhole defects.

In addition, even if the radiation heat of the side heater is intensified with the crucible being raised, the crucible opening part will not be excessively heated, the crucible bottom part being mainly heated. Therefore, deformation of the crucible opening part will not be caused.

In addition, according to the present embodiment, the raw material is melted, while the natural convection in the melt is strengthened to spatter the gas bubbles toward the outside, thus as compared to First Embodiment, the period of time from melting the raw material to eliminating the gas bubbles can be shortened.

[Third Embodiment]

In the present embodiment, the initial position of the quartz crucible 4 is set as high as possible, and the quartz crucible 4 and the like are raised before the raw material is melted.

After putting lumps of silicon raw material 30 into the inside of the quartz crucible 4, the elevation mechanism 2 is operated to dispose the graphite crucible 3 and the like in the initial position. At this time, the graphite crucible 3 and the like are located such that the quartz crucible bottom part 4b is positioned above the heat center. The quartz crucible 4 and the like are held in this position while the side heater 5 is activated to heat the quartz crucible bottom part 4b. Then, the raw material 30 inside in the quartz crucible 4 is melted, resulting in a melt 31 being formed.

According to the present embodiment, from the initial stage of melting the material, the amount of heat applied to the crucible bottom part may be made greater than the amount of heat applied to the crucible side surface. By doing so, the natural convection in the melt inside the crucible is so strengthened that the gas bubbles are spattered to the outside. Thus, without the radiation heat of the side heater being intensified, the natural convection inside of the crucible can be strengthened, and the amount of gas bubbles in the melt can be minimized. The silicon single crystal formed from such melt contains practically no gas bubbles. If a wafer is cut down from such silicon single crystal, the wafer formed will have a minimized number of pinhole defects.

In addition, even if the radiation heat of the side heater is intensified with the crucible being raised, the crucible opening part will not be excessively heated, the crucible bottom part being mainly heated. Therefore, deformation of the crucible opening part will not be caused.

In addition, according to the present embodiment, the raw material is melted, while the natural convection in the melt is strengthened to spatter the gas bubbles toward the outside, thus as compared to First Embodiment, the period of time from melting the raw material to eliminating the gas bubbles can be shortened.

[Fourth Embodiment]

The present embodiment relates to control at the time of pulling-up the single crystal following the formation of the melt, while the above-stated First through Third Embodiments relate to control at the time of melt formation.

In the melt formed in any one of the above-stated First through Third Embodiments, after being dipped, a seed crystal is pulled up to grow a single crystal. In the present embodiment, the pulling-up mechanism 9 pulls up the seed crystal while rotating it around the axis of the pulling-up shaft. The circumferential speed therefor is 0.136 m/s or higher, and the upper limit thereof is 0.21 m/s, which is the highest possible speed at which the crystal can be actually pulled up. By rotating the seed crystal, the effect that the gas bubbles are discharged from the melt (so-called the spewing-out effect) is enhanced, whereby the amount of gas bubbles in the silicon single crystal formed can be further minimized.

According to the experiment that has been conducted by the present inventor, although the rate of occurrence of pinhole defect by the related art was 0.3%, the rate can be reduced to 0.1% using the present invention.

For the respective embodiments, various aspects can be conceived.

For example, in First through Third Embodiments, although the quartz crucible 4 and the like are raised, the side heater 5 may be lowered instead. Lowering the side heater 5 provides the same effect as that of raising the quartz crucible 4 and the like.

In addition, in First and Second Embodiments, the radiation heat of the side heater 5 may be intensified after the crucible having been raised. In addition, in Third Embodiment, the radiation heat of the side heater 5 may be more intensified than in the case with the prior art. By intensifying the radiation heat, the time required for melting the raw material and eliminating the gas bubbles can be further shortened.

What is claimed is:

1. A method for reducing gas bubbles in melt formed by initially melting semiconductor wafer raw material using a single crystal manufacturing apparatus that comprises a crucible and a side heater provided so as to surround a side surface of the crucible, the method comprising the following steps to be performed in sequence before manufacturing a single crystal:

first, placing raw material into the crucible;

second, a side heating step of mainly heating the side surface of the crucible using the side heater for partly melting the raw material in the crucible to form the melt where the raw material is partly melted and some unmelted raw material is still present;

third, an adjusting step of adjusting, prior to complete melting of said raw material, a relative position between the crucible and the side heater such that the amount of heat applied to a bottom part of the crucible by the side heater is greater than the amount of heat applied to the side surface of the crucible after the melt where the raw material which is partly melted is formed; and fourth, a bottom heating step of maintaining the adjusted relative position and heating the bottom part of the crucible by the side heater for at least 60 minutes after the state in which the melt where the raw material is partly melted is formed has arrived, reducing the gas bubbles in the melt.

2. The method for melting semiconductor wafer raw material according to claim 1, wherein in the adjusting step, within a range where the crucible moves up and down, the crucible is raised to not lower than a position where the bottom part of the crucible is maintained to a part where radiation heat by the side heater is the most intense.

3. The method for melting semiconductor wafer raw material according to claim 1, wherein In the adjusting step, within a range where the side heater moves up and down, the side heater is lowered to not higher than a position where the bottom part of the crucible is maintained to a part where radiation heat with the side heater is the most intense.

4. The method for melting semiconductor wafer raw material according to claim 1, wherein the radiation heat by the side heater in the bottom heating step in more intense than the radiation heat by the side heater in the side heating step.

5. The method for melting semiconductor wafer raw material according to claim 1, wherein in the bottom heating step, the crucible is raised to such a position where a member disposed above the crucible does not interfere with an opening part of the crucible and the raw material in the crucible.

6. The method for melting semiconductor wafer raw material according to claim 1, wherein the crucible comprises a first crucible in which the water raw material is put and a second crucible inside which a part or the first crucible is installed, when a vertical length of the side heater is defined as L1, a vertical length of the second crucible is defined as L2, and vertical component of a distance from the inner bottom end of the first crucible to a lower end of the side heater is defined as d, the following expression is met:

$$(½)L2<L1<2L2, \text{and}$$

in the bottom heating step, the first crucible is maintained in such a position where the following expression is met:

$$(¼)1d(¾)L1.$$

7. The method for melting semiconductor wafer raw material according to claim 1, wherein in the bottom heating step, the crucible is rotated at 0.5 to 15 rpm.

8. A crystal growing method for semiconductor wafer, when, after a seed crystal is dipped into melt formed by the method as stated in claim 1, the seed crystal is pulled up to grow crystal, the seed crystal is pulled up while being rotated at a circumferential velocity of 0.136 m/s or faster.

9. A method for reducing gas bubbles in melt formed by initially melting semiconductor wafer raw material using crystal manufacturing apparatus that comprises a crucible and a side heater arranged so as to surround a side surface of the crucible, the method comprising the following steps to be performed in sequence before manufacturing a single crystal and after placing raw material in the crucible:

first, an adjusting step of adjusting, prior to complete melting of said raw material, a relative position between the crucible and the side heater such that amount of heat applied to a bottom part of the crucible by the side heater is greater than amount of heat applied to the side surface of the crucible; and second, a bottom heating step, while of maintaining the adjusted position and heating the bottom part of the crucible for melting the raw material to form the melt and partly melting the raw material in the crucible and, since the state in which the melt where the raw material is melted is formed has arrived and some unmelted raw material is still present, and, after the melt is formed, heating the bottom part of the crucible by the heater for at least 60 min. thereby reducing the gas bubbles in the melt.

10. The method for melting semiconductor wafer raw waterial according to claim 9, wherein
in the bottom heating step, the crucible is raised to such a position where a member disposed above the crucible does not interfere with an opening part of the crucible and the raw material in the crucible.

* * * * *